(12) United States Patent
Chen et al.

(10) Patent No.: US 7,561,407 B1
(45) Date of Patent: Jul. 14, 2009

(54) MULTI-SEGMENT CAPACITOR

(75) Inventors: Shuxian Chen, Fremont, CA (US);
Jeffrey T. Watt, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 517 days.

(21) Appl. No.: 11/289,341

(22) Filed: Nov. 28, 2005

(51) Int. Cl.
*H01G 4/228* (2006.01)
(52) U.S. Cl. .............. 361/306.1; 361/306.3; 361/321.1; 361/302; 361/303; 361/308.1
(58) Field of Classification Search .............. 361/306.1, 361/306.3, 302–303, 309, 301.1, 301.4, 308.3
See application file for complete search history.

(56) References Cited

U.S. PATENT DOCUMENTS 5,583,359 A * 12/1996 Ng et al. ..................... 257/306
5,978,206 A * 11/1999 Nishimura et al. .......... 361/303
6,385,033 B1 * 5/2002 Javanifard et al. ......... 361/306.2
6,407,907 B1 * 6/2002 Ahiko et al. .............. 361/306.3

OTHER PUBLICATIONS

Aparicio, Roberto and Ali Hajimiri. "Capacity Limits and Matching Properties of Integrated Capacitors". *IEEE Journal of Solid-State Circuits*. vol. 37, No. 3, Mar. 2002, pp. 384-393.

* cited by examiner

*Primary Examiner*—Nguyen T Ha
(74) *Attorney, Agent, or Firm*—Ward & Olivo

(57) ABSTRACT

A multi-segment capacitor fabricated on a semiconductor substrate includes M×N capacitor segments arranged in a matrix of M rows and N columns. Each capacitor segment includes two groups of conductive fingers preferably made of metal wires. The metal wire fingers are distributed within multiple metal layers in such a manner that two neighboring parallel metal wire fingers within a particular metal layer are electrically insulated and connected to different terminals of the capacitor. Further, at least the longitudinal axes of the parallel metal wire fingers within two different metal layers are not parallel to each other within the same capacitor segment.

9 Claims, 6 Drawing Sheets

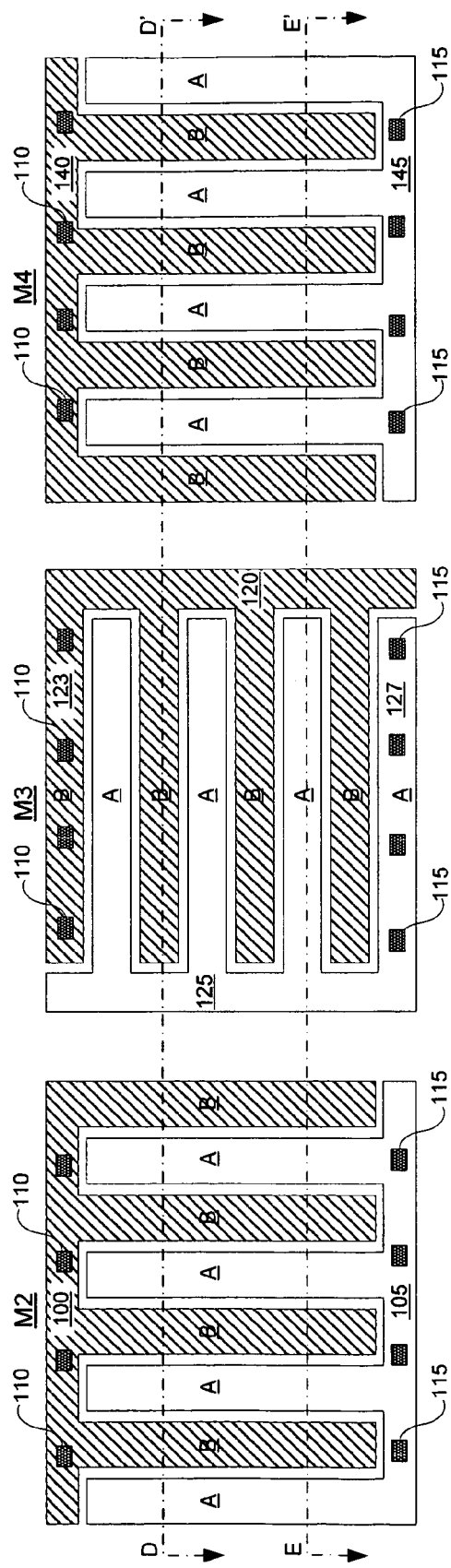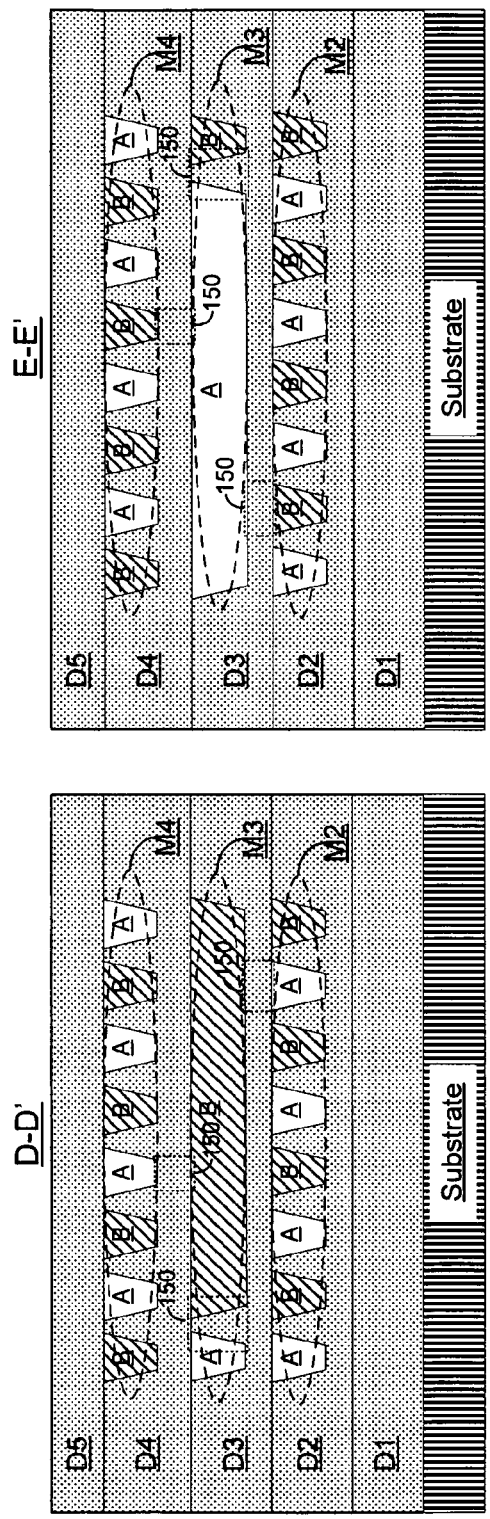

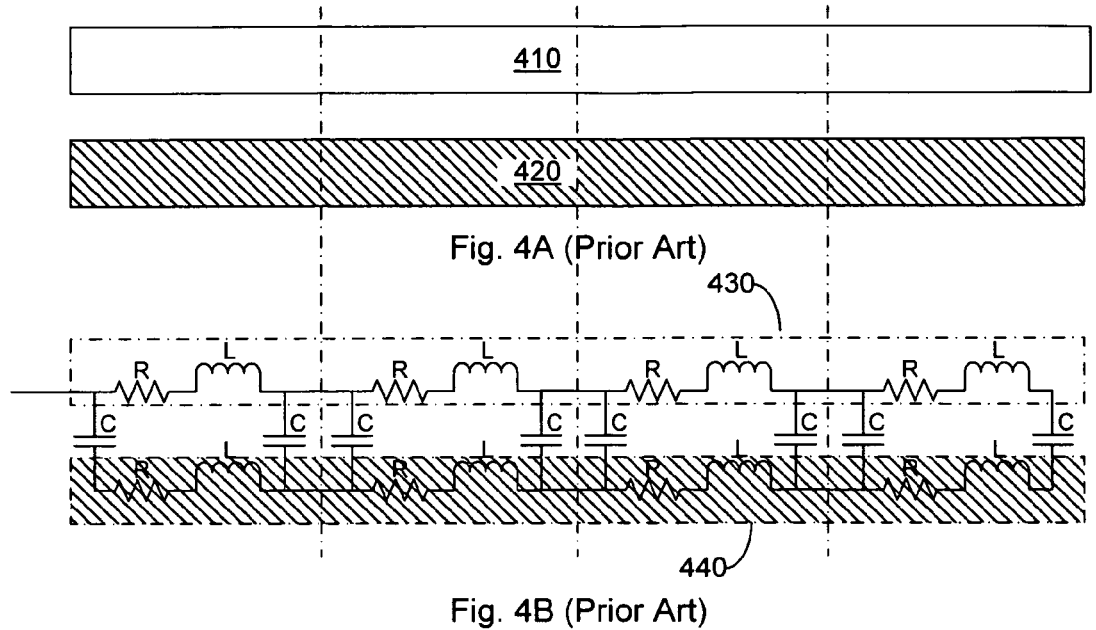
Fig. 4A (Prior Art)
Fig. 4B (Prior Art)
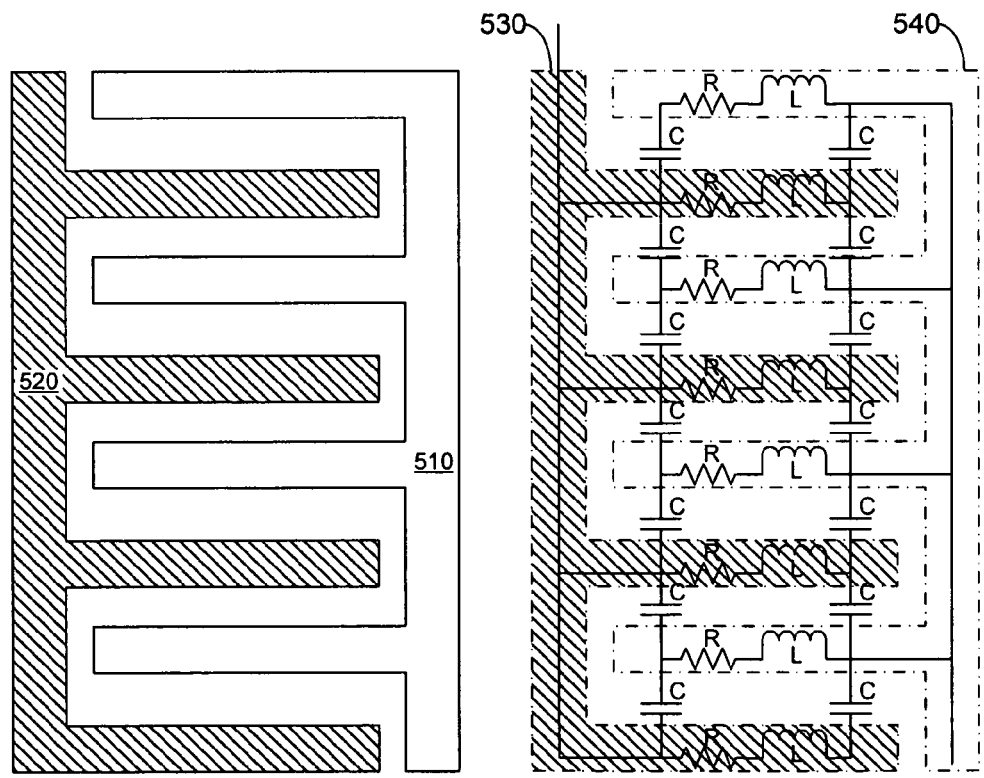
Fig. 5A
Fig. 5B

MULTI-SEGMENT CAPACITOR

RELATED APPLICATIONS

This application is related to U.S. patent application Ser. No. 11/166,733, filed Jun. 23, 2005, entitled "Multi-Segment Parallel Wire Capacitor," which is incorporated by reference herein in its entirety.

FIELD OF THE INVENTION

The present invention relates generally to the field of integrated circuit (IC) design and manufacture, and in particular, to a multi-segment capacitor structure fabricated on a semiconductor substrate.

BACKGROUND

High-capacitance, on-chip capacitors are widely used in various types of digital and analog ICs such as dynamic random access memory (DRAM) and phase-lock loop (PLL), etc. Traditionally, such a capacitor comprises two sets of parallel metal wires embedded in different dielectric layers above a semiconductor substrate, each set being connected to one of the two terminals of the capacitor. The capacitance of the capacitor is a function of the number of metal wires connected to one terminal, their respective length, width, and distance to neighboring metal wires connected to the other terminal. For example, a capacitor having longer metal wires usually has a higher capacitance provided that other geometric parameters remain the same.

Several shortcomings have been attributed to the aforementioned design of a capacitor structure. First, it is not flexible. Each specific design is associated with a fixed capacitance. If an IC requires a capacitance different from an existing design, a circuit designer has to compute a different set of geometric parameters for a new capacitor structure that will provide the required capacitance. As a result, the IC manufacturing process has to be modified to fabricate the new capacitor structure. If an IC needs multiple on-chip capacitors, each having a unique capacitance, this could significantly increase the cost of IC design and manufacturing. Second, a capacitor comprised of longer metal wires is often accompanied by serious side effects. Such a capacitor tends to have higher parasitic resistance and inductance. This reduces the efficiency of the capacitor, especially at higher frequencies.

In view of the aforementioned issues, there is a need for an on-chip capacitor structure that is flexible to satisfy different capacitance requirements. It is also desirable that the capacitor structure have a better performance than the conventional on-chip capacitors in the domain of high operating frequencies.

SUMMARY

In a preferred embodiment of the present invention, a multi-segment capacitor fabricated on a semiconductor substrate includes M×N capacitor segments arranged in a matrix of M rows and N columns. Each capacitor segment includes two groups of conductive fingers preferably made of metal wires. The two groups of metal wire fingers are distributed within multiple metal layers in such a manner that two neighboring parallel metal wire fingers within a particular metal layer are electrically insulated and connected to different terminals of the capacitor. Further, at least the longitudinal axes of the parallel metal wire fingers within two different metal layers are not parallel to each other within the same capacitor segment.

From a top view, the M×N capacitor segments are arranged in a matrix having M rows and N columns. M and N may or may not be the same. The M×N capacitor segments are interconnected in such a manner that the two groups of metal wire fingers of the capacitor segments in each column are connected in parallel. The metal wire fingers of different columns of the capacitor segments are selectively connected to a first metal line and a second metal line that serve as the two terminals of the capacitor matrix. As a result, the capacitor matrix has a capacitance that is substantially the sum of the capacitance of each individual capacitor segment.

BRIEF DESCRIPTION OF THE DRAWINGS

The aforementioned aspects of the invention as well as additional aspects will be more clearly understood as a result of the following detailed description of the various embodiments of the invention when taken in conjunction with the drawings. Like reference numerals refer to corresponding parts throughout the several views of the drawings.

FIGS. 1A-1E are three top views and two cross-sectional views illustrating structures of a capacitor segment within different metal layers in accordance with some embodiments of the present invention.

FIGS. 4A and 4B are diagrams illustrating a prior art capacitor and its equivalent electrical circuit.

FIGS. 5A and 5B are diagrams illustrating a capacitor and its equivalent electrical circuit in accordance with some embodiments of the present invention.

DESCRIPTION OF EMBODIMENTS

Figure 1F:
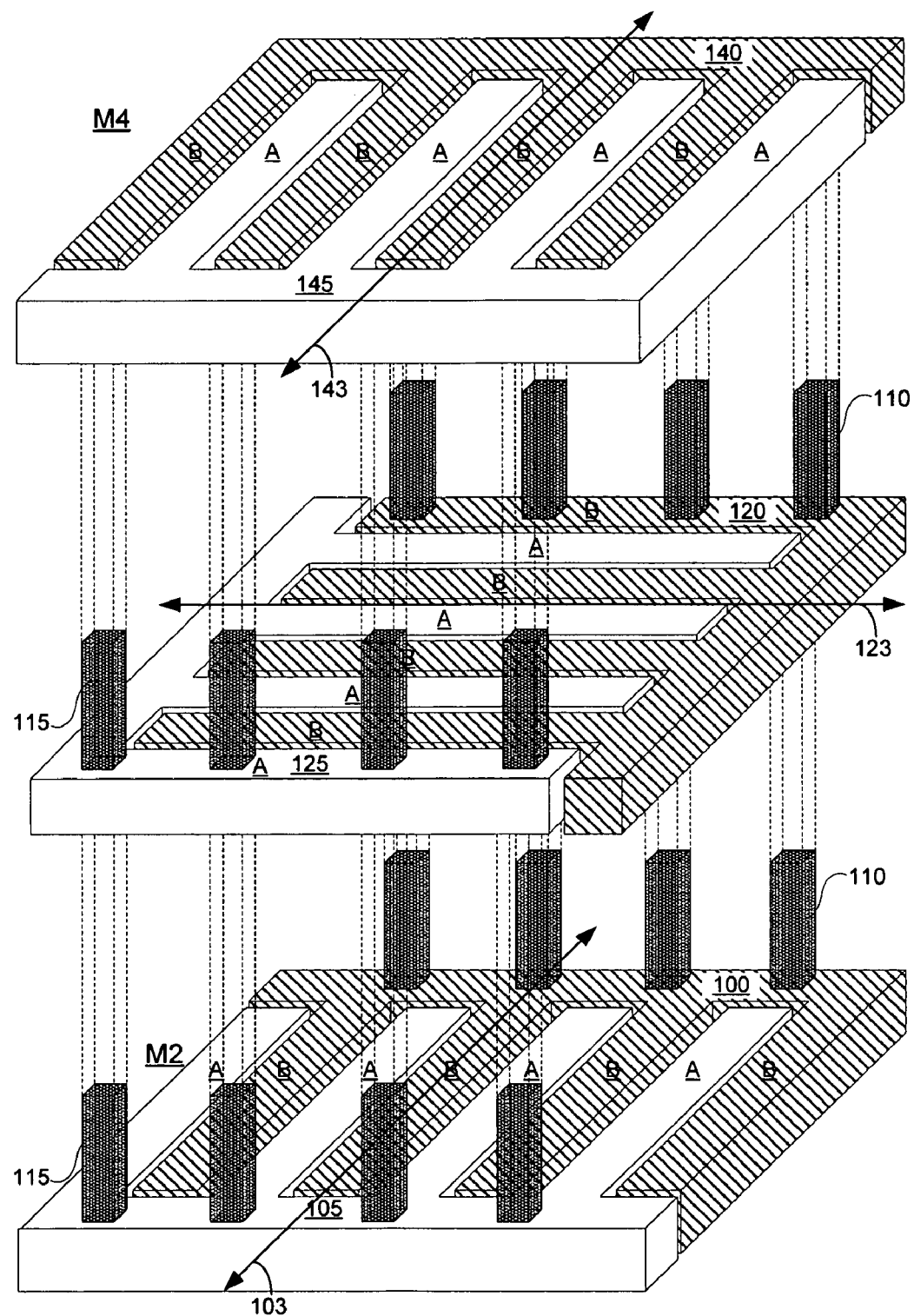
FIG. 1F is a 3-D isometric view of the capacitor segment in accordance with some embodiments of the present invention.

Problems associated with the conventional on-chip capacitor structure, as mentioned above in the background section, can be solved or at least substantially alleviated by fragmentizing a single, large (relative to the chip size), on-chip capacitor structure into many small segments. Each segment by itself is a capacitor having its own pair of terminals and a specific capacitance. Through appropriate inter-segment connections, multiple segments are connected together to form an on-chip capacitor having a larger capacitance.

In some embodiments, the on-chip capacitor has a capacitance that is substantially the sum of the capacitance of each individual capacitor segment. Therefore, given a specific capacitance requirement, a circuit designer can easily determine the number of capacitor segments satisfying the requirement and then connect them in accordance with a specific connection scheme. If an IC requires multiple on-chip capacitors having different capacitances, instead of re-computing geometric parameters for different capacitors, the circuit designer may apply the same design methodology mentioned above to each individual on-chip capacitor.

FIGS. 1A, 1B, and 1C are three schematic top views illustrating the structures of a capacitor segment within three neighboring metal layers in accordance with some embodiments of the present invention. The capacitor segment includes three capacitor elements, each capacitor element having two sets of interleaved parallel conductive fingers identified by their respective fill patterns. FIG. 1A depicts the capacitor element in the second metal layer M2. The capacitor element includes two sets of metal wire fingers, one set being labeled "A" and the other set being labeled "B." A metal line 100 connects one end of each B finger together, serving as one terminal of the capacitor element. Another metal line 105 connects one end of each A finger together, serving as the other terminal of the capacitor element. The dark rectangular boxes 110 and 115 on the two metal lines 100 and 105 correspond to metal vias connecting this capacitor element to adjacent capacitor elements in different metal layers, but associated with the same capacitor segment.

FIG. 1B illustrates another capacitor element in the third metal layer M3. In this embodiment, the two sets of interleaved metal wire fingers A and B associated with this capacitor element are perpendicular, not parallel, to the metal wire fingers shown in FIG. 1A. In order to electrically couple this capacitor element to the one in the second metal layer M2, the two sets of vertical metal vias 110 and 115 are brought into physical contact with the two metal fingers 123 and 127, respectively. Each of the two sets of metal wire fingers are connected together by one of the two metal lines 120 and 125 to form one of the two terminals of the capacitor element.

FIG. 1C depicts a third capacitor element in the fourth metal layer M4. This capacitor element is substantially similar to the one shown in FIG. 1A. For instance, a metal line 140 connects one end of each B finger together serving as one terminal of the capacitor element whereas another metal line 145 connects one end of each A finger together, serving as the other terminal of the capacitor element. But note that the spatial sequence of the metal wire fingers in FIG. 1C is different from that shown in FIG. 1A.

FIGS. 1D and 1E are two cross-sectional views of the capacitor segment along the cut-through lines D-D' and E-E', respectively, to better illustrate its internal structure. As shown in FIGS. 1D and 1E, five dielectric layers D1 to D5 are stacked together on top of a semiconductor substrate. There are three metal layers M2, M3 and M4 embedded in the dielectric layers D2, D3 and D4, respectively. The metal wire fingers A and B are formed in the three metal layers M2, M3, and M4 and electrically insulated from one another by the dielectric material. Since the lines D-D' and E-E' are perpendicular to the metal wire fingers in the metal layers M2 and M4 and parallel to the metal wire fingers in the metal layer M3, the two cross-sectional views depict similar structures in the metal layers M2 and M4, but different ones in the metal layers M3 depending on the locations of the two cut-through lines. For illustrative purposes, boxes 150 in the two figures highlight the locations where two metal wire fingers contribute to the capacitance of the capacitor segment. Note that the spatial sequence of metal wire fingers in metal layer M2 is different from that in metal layer M4. The sequence in layer M2 begins on the left hand side with an A finger while the sequence in layer M4 begins with a B finger. This configuration helps to increase the capacitance of the segment by enlarging the surface area of the two sides of the capacitor segment because there is always a B finger in metal layer M4 directly above an A finger in metal layer M2 and vice versa.

For illustrative purposes, this capacitor segment includes three capacitor elements. But one skilled in the art will appreciate that the capacitor segment may have more than three capacitor elements or as few as only two capacitor elements. Advantageously, when designing an IC sensitive to parasitic capacitance or inductance, no capacitor elements or other metal lines or dummy metal fills should be directly below the capacitor element in metal layer M2 or directly above the capacitor element in metal layer M4. This configuration reduces the parasitic capacitance between the capacitor segment and its surrounding structures. The metal vias connecting different capacitor elements are fabricated at designated locations in the dielectric layers during the fabrication of the metal layers and capacitor elements. These metal vias, as will be shown in FIG. 1F, connect the capacitor elements in the dielectric layers in accordance with a predefined scheme to form a capacitor segment.

FIG. 1F is a 3-D isometric view of the capacitor segment. The metal lines connected to the interleaved metal wire fingers of the three capacitor elements are connected together by two sets of metal vias 110 and 115. As a result, half of the interleaved metal wire fingers (or B fingers) are connected in parallel to the metal lines 100, 120, and 140 and the other half of the interleaved metal wire fingers (or A fingers) are connected to the metal lines 105, 125, and 145. These two halves correspond to the two plates or terminals of the capacitor segment. The two plates are electrically insulated from each other by dielectric material as shown in FIGS. 1D and 1E. Note that the longitudinal axis 123 of the metal wire fingers of the middle capacitor element in FIG. 1F is not parallel to the longitudinal axes 143 and 103 of the metal wire fingers of the top and bottom capacitor element. More specifically, the longitudinal axis 123 is perpendicular to the longitudinal axes 143 and 103. The metal wire fingers of the top and bottom capacitor elements have different spatial sequences. Benefits inherent in this configuration have been mentioned before in connection with FIGS. 1D and 1E. In some embodiments, such a capacitor segment may have a capacitance ranging from 50 fF to 70 fF depending on the geometric dimensions and material composition of the capacitor segment.

As mentioned above, the fragmentation of one large capacitor into many small capacitor segments allows the capacitor segments to be connected together in accordance with a specific scheme to form an on-chip capacitor having a predetermined capacitance. Two embodiments of multi-segment metal wire capacitors are disclosed in FIGS. 2A-2B and 3A-3B, respectively. Since each capacitor segment includes multiple capacitor elements distributed in different metal layers, there are many possible schemes of forming a multi-segment capacitor by connecting the multiple capacitor elements in a predefined manner. For simplicity, FIGS. 2A and 3A only depict a matrix of capacitor elements that are electrically connected by metal interconnects within a particular metal layer based on one connection scheme. But one of ordinary skill in the art will understand that it is not necessary that all the metal interconnects connecting different capacitor segments are within the same metal layer.

Figure 2A:
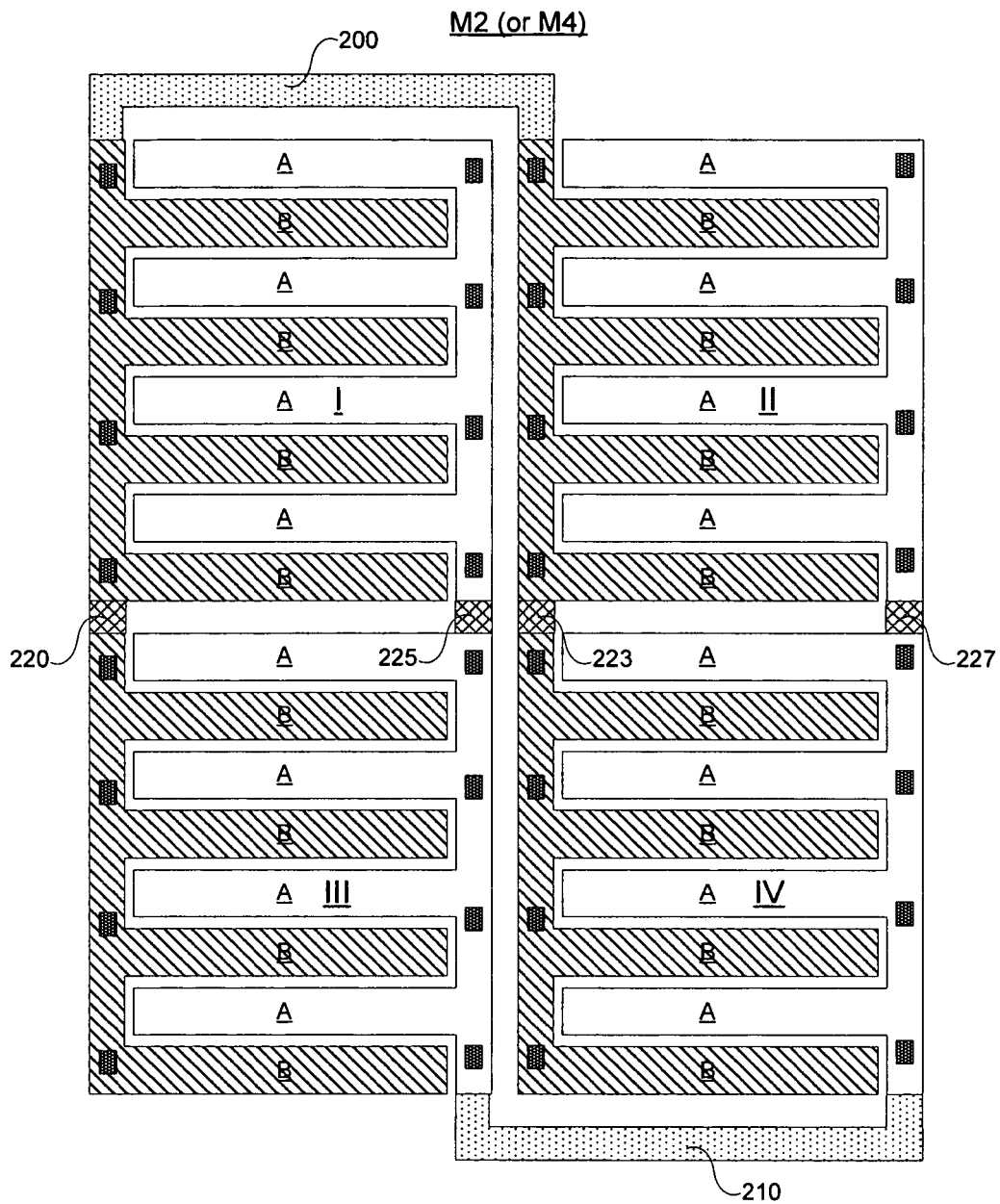
FIG. 2A is a top view of structures of a 2×2 multi-segment capacitor matrix within a dielectric layer in accordance with some embodiments of the present invention.

FIG. 2A is a top view illustrating the structure of four capacitor elements I-IV arranged in a 2×2 matrix within metal layer M2 (or M4). Each of the four capacitor segments has two sets of interleaved fingers A and B, which correspond to two opposing plates or terminals of a capacitor segment. These fingers are vertically connected to other fingers having the same label but within other metal layers. Horizontally, these fingers are electrically insulated from one another by dielectric material except where the metal interconnects are deployed. In particular, terminal B of capacitor element I is connected in parallel to terminal B of capacitor element III through metal interconnect 220, and terminal B of capacitor element II is connected in parallel to terminal B of capacitor element IV through metal interconnect 223. A metal line 200 connects terminal B of capacitor element I to terminal B of capacitor element II, corresponding to one terminal of the 2×2 capacitor segment matrix. Terminal A of capacitor element I is connected in parallel to terminal A of capacitor element III through interconnect 225, and terminal A of capacitor element II is connected to terminal plate A of capacitor element IV through interconnect 227. Another metal line 210 is connected to terminal plate A of capacitor element III and terminal A of capacitor element IV, corresponding to the other terminal of the 2×2 capacitor segment matrix. Advantageously, metal interconnects 220, 223, 225, 227 and metal lines 200, 210 are physically part of metal layer M2 (or M4) and formed together with fingers A and B in metal layer M2 (or M4).

Figure 2B:
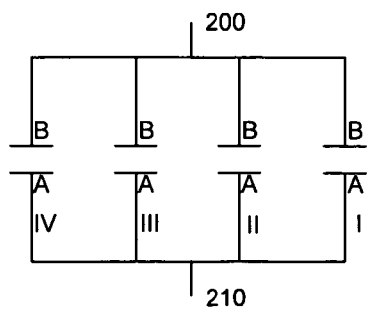
FIG. 2B is a schematic diagram illustrating the equivalent circuit of the 2×2 multi-segment capacitor matrix.

FIG. 2B is a schematic diagram illustrating the equivalent circuit of the 2×2 capacitor segment matrix shown in FIG. 2A. Since the four individual capacitor segments are connected in parallel, the capacitance of the 2×2 multi-segment metal wire capacitor $C_{2\times2}$ is the sum of the capacitances of the four individual capacitor segments:

$$C_{2\times2}=C_I+C_{II}+C_{III}+C_{IV}.$$

Figure 3A:
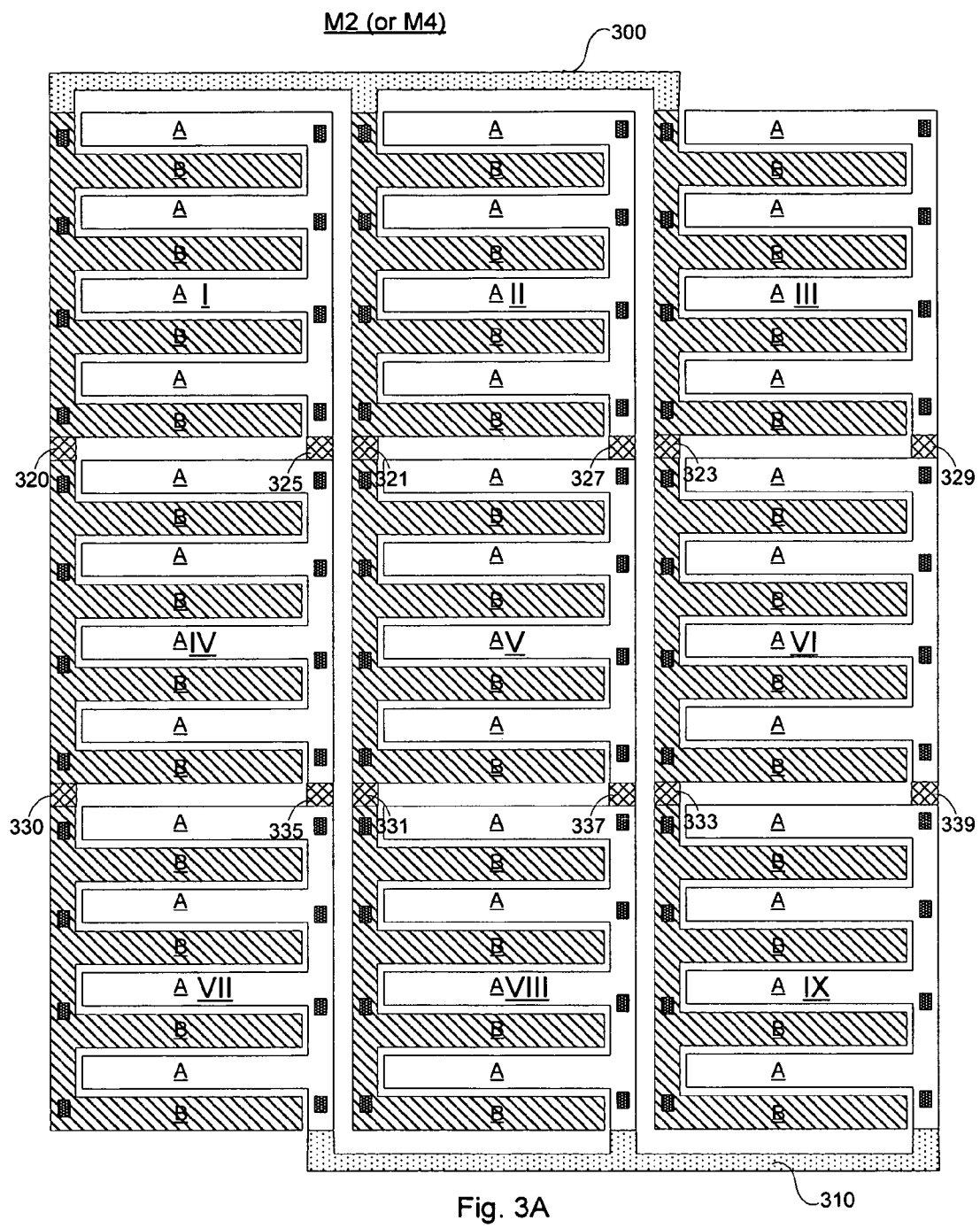
FIG. 3A is a top view of structures of a 3×3 multi-segment capacitor matrix within a dielectric layer in accordance with some embodiments of the present invention.

FIG. 3A is the structure of nine capacitor elements I-IX arranged in a 3×3 matrix within metal layer M2 (or M4). Each of the nine capacitor segments has two sets of interleaved fingers A and B, which correspond to two opposing plates or terminals of a capacitor segment. These fingers are vertically connected to other fingers having the same label but within other metal layers. Horizontally, these fingers are electrically insulated from one another by dielectric material except where the metal interconnects are deployed. The nine capacitor elements are inter-connected in a manner similar to the connection scheme shown in FIG. 2A. Terminals B of capacitor elements I, IV, and VII are connected in parallel by interconnects 320 and 330, terminals B of capacitor elements II, V and VIII are connected in parallel by interconnects 321 and 331, and terminals B of capacitor elements III, VI and IX are connected in parallel by interconnects 323 and 333. At one end of the 3×3 capacitor segment matrix, a metal line 300 connects terminals B of capacitor element I to terminal B of capacitor element II and terminal B of capacitor element III, corresponding to one terminal of the 3×3 multi-segment metal wire capacitor. Terminals A of capacitor elements I, IV and VII are connected in parallel by interconnects 325 and 335, terminals A of capacitor elements II, V and VIII are connected in parallel by interconnects 327 and 337, and terminals A of capacitor elements III, VI and IX are connected in parallel by interconnects 329 and 339. Another metal line 310 connects terminal A of capacitor element VII to terminal A of capacitor element VIII and terminal A of capacitor element IX, corresponding to the other terminal of the 3×3 capacitor segment matrix. Again, the metal interconnects and metal lines are physically part of metal layer M2 (or M4) and formed together with fingers A and B in metal layer M2 (or M4).

Figure 3B:
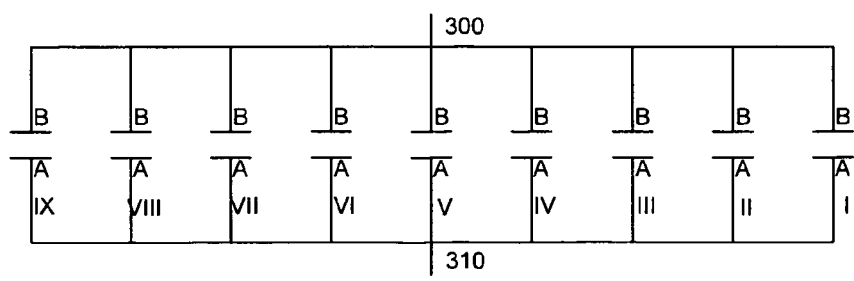
FIG. 3B is a schematic diagram illustrating the equivalent circuit of the 3×3 multi-segment capacitor matrix.

FIG. 3B is a schematic diagram illustrating the equivalent circuit of the 3×3 multi-segment capacitor shown in FIG. 3A. Since the nine individual capacitor segments are connected in parallel, the capacitance of the 3×3 multi-segment metal wire capacitor $C_{3\times3}$ is the sum of the capacitances of the nine individual capacitor segments:

$$C_{3\times3}=C_I+C_{II}+\ldots+C_{IX}.$$

In either embodiment discussed above, if all the member capacitor segments have an identical predetermined capacitance, the capacitance of the multi-segment metal wire capacitor is substantially the predetermined capacitance multiplied by the number of member capacitor segments being connected in parallel together (4 or 9). One skilled in the art will also realize that connecting all the capacitor segments in parallel as discussed above is only for illustrative purposes and it is by no means the only connection scheme available for a certain number of standalone capacitor segments. As a matter of fact, given a required capacitance and the number of standalone capacitor segments, a circuit designer may find many different connection schemes. From these connection schemes, the designer may choose one that is particularly appropriate under certain criteria, e.g., how easy to manufacture the multi-segment capacitor, how efficient the multi-segment capacitor is, or how reliable the multi-segment capacitor is when subject to a certain amount of noise, etc.

In some embodiments, the required capacitance may not be close to a multiple of an individual capacitor segment. It is therefore necessary to include two or more serially connected capacitor segments in the multi-segment metal wire capacitor. For example, a multi-segment metal wire capacitor whose capacitance is 4.5 times the capacitance of one segment may be composed of six capacitor segments, two being serially connected and then being connected in parallel to the other four segments. Sometimes, there may be multiple connection schemes that can produce the same required capacitance. Different schemes are chosen depending on many other design-related considerations, e.g., the location of the multiple capacitor segments on the substrate, or the electronic application employing the multiple-segment capacitor, etc.

The aforementioned embodiments illustrate how multiple capacitor segments are wired to produce a multi-segment capacitor having a desired capacitance. The flexibility in terms of wiring schemes is a significant improvement of the present invention over the conventional on-chip capacitor structure. Additionally, the Q-factor of a multi-segment metal wire capacitor according to the present invention is usually higher than that of a conventional on-chip capacitor structure. For simplicity, the subsequent discussion is limited to a capacitor element within a capacitor segment and a corresponding structure in a prior art on-chip capacitor. But one of ordinary skill in the art will appreciate that the same or similar conclusion can be reached for a multi-segment metal wire capacitor.

FIG. 4A depicts a pair of long metal wires 410 and 420 that are part of a prior art capacitor. These two metal wires represent two opposing terminals of a capacitor. FIG. 4B depicts an equivalent circuit overlaid on the two long metal wires when the two wires operate in a high frequency domain. The equivalent circuit is comprised of two branches 430 and 440, each having four sets of parasitic resistor R and parasitic inductor L and each set corresponding to one of the four sections of the long metal wires 410 or 420 as shown in FIG. 4A. The two branches of the equivalent circuit are electrically coupled to each other in the high frequency domain by multiple capacitors C. Since the parasitic resistors and parasitic inductors within each branch are serially connected, the electrical power wasted by the four sets of parasitic resistor and parasitic inductor is roughly four times the power consumed by one set of parasitic resistor and parasitic inductor.

FIG. 5A depicts a capacitor element according to some embodiments of the present invention. The capacitor element is composed of two opposing terminals 510 and 520, each terminal including four metal wire fingers. The four metal wire fingers associated with the two terminals 510 and 520 are interleaved within a metal layer. Note that the geometric parameters of each metal wire finger, e.g., its length, depth, and width, are about the same as those of one of the four sections of metal wires 410 or 420. Therefore, the capacitance of a pair of metal wire fingers in FIG. 5A is similar to that of two opposing metal wire sections in FIG. 4A.

However, as shown in FIG. 5B, the equivalent circuit of the capacitor element is significantly different from that of the pair of metal wires shown in FIG. 4A. For example, after ignoring fingers at the top and bottom, each metal wire finger coupled to terminal 520 is sandwiched by two metal wire fingers coupled to the opposing terminal 510 and vice versa. The four sets of parasitic resistors and parasitic inductors associated with each branch are not serially connected, but are connected in parallel, and each set is electrically coupled to two neighboring sets associated with the other branch. As a result, the parasitic resistance (or parasitic inductance) of one branch 520 is only about a quarter of the parasitic resistor R (or parasitic inductor L) of each individual metal wire finger. Consequently, when the capacitor element operates in a high frequency domain, much less electric power is wasted by the parasitic resistors and there is less inductive effect in the capacitor element. This reduction of inductive effect improves the performance of a corresponding multi-segment capacitor matrix. In other words, the Q factor of the capacitor element shown in FIG. 5A is higher than that of the prior art capacitor shown in FIG. 4A.

While the invention has been described for the case where the terminals of the capacitor segments in each column of the capacitor matrix are connected in parallel, the invention may also be practiced where the terminals of the capacitor segments in each row of the matrix are connected in parallel and the two metal lines that serve as opposing terminals of the capacitor matrix are connected to the first and last columns of the matrix.

Figure 6A:
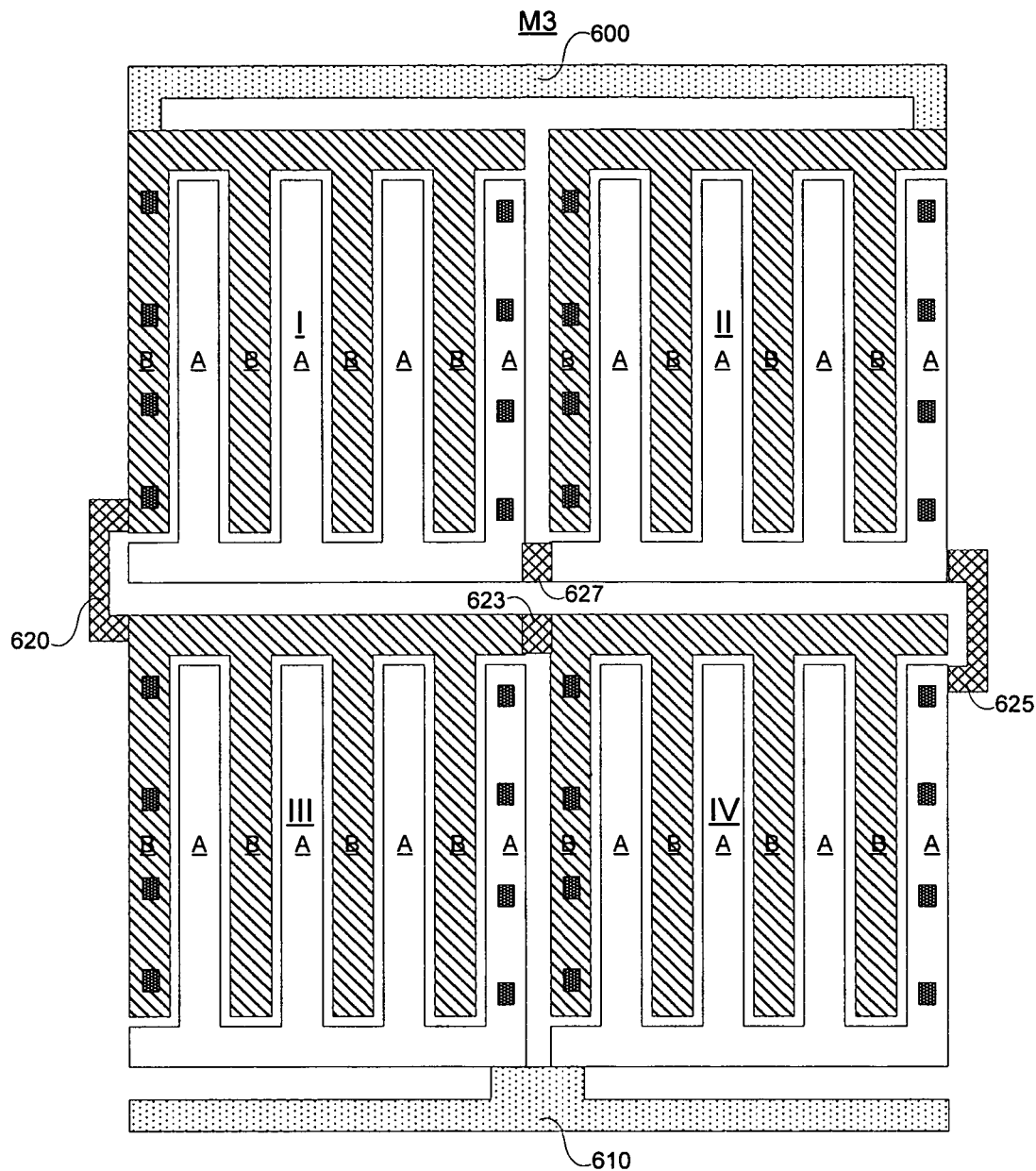
FIG. 6A is a top view of structures of another 2×2 multi-segment capacitor matrix within a dielectric layer in accordance with some embodiments of the present invention.
Figure 6B:
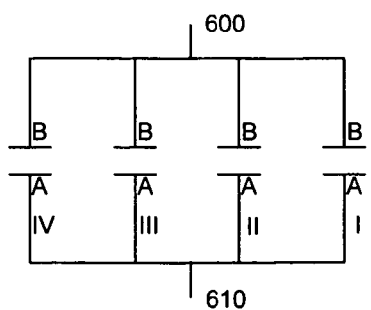
FIG. 6B is a schematic diagram illustrating the equivalent circuit of the 2×2 multi-segment capacitor matrix.

FIGS. 6A and 6B illustrate such a 2×2 multi-segment capacitor matrix wired together by a connection scheme in accordance with a different embodiment of the present invention. Unlike the 2×2 multi-segment capacitor matrix shown in FIG. 2A, the metal interconnects and metal lines connecting the four capacitor segments are all located in metal layer M3. Note that the longitudinal axis of the metal wire fingers in FIG. 6A is perpendicular to those in FIGS. 2A and 3A. Specifically, terminals B of the two capacitor elements I and II in the first row are connected in parallel by metal line 600 and terminals A of the two capacitor elements III and IV in the second row are connected in parallel by metal line 610. Metal interconnects 620, 623, 625, and 627 connect two terminals having the same label within each column (or row) in parallel. FIG. 6B depicts the equivalent circuit of the 2×2 capacitor matrix shown in FIG. 6A. Note that in this example, terminals B of the four capacitor segments serve as one terminal of the capacitor matrix while terminals A of the four capacitor segments serve as the other terminal of the capacitor matrix. Since the four individual capacitor segments are connected in parallel, the capacitance of the 2×2 multi-segment metal wire capacitor is the sum of the capacitances of the four individual capacitor segments.

The foregoing description, for purpose of explanation, has been set forth with reference to specific embodiments. However, the illustrative discussions above are not intended to be exhaustive or limit the invention to the precise forms disclosed. Illustratively, all the metal interconnects and metal lines in the aforementioned embodiments are within the same metal layer. One skilled in the art will find that this requirement is optional and it is possible to have a connection scheme whose metal interconnects are located in multiple metal layers. Moreover, while the preferred embodiment of the invention locates the metal fingers of one layer directly above the metal fingers of a lower layer, the invention may also be practiced in situations where the fingers of one layer are offset from a position directly above the fingers of a lower layer. Although the capacitor segments depicted in the aforementioned embodiments are made of metal wire fingers, one of ordinary skill in the art will appreciate that these capacitor segments can be made of other conductive materials. For example, in some applications, polysilicon can be used to form the fingers of the capacitor element. Still other variations will be obvious to one of ordinary skill in the art.

What is claimed is:

1. A multi-segment capacitor fabricated on a semiconductor substrate, comprising:
    multiple banks of capacitor segments, the capacitor segments within each bank being connected in parallel, each capacitor segment including a plurality of capacitor elements, each capacitor element including two sets of electrically insulated and spatially interleaved parallel conductive fingers having a longitudinal axis;
    wherein the conductive fingers of a first capacitor element of at least one capacitor segment have a longitudinal axis that is not parallel to the longitudinal axis of the conductive fingers of a second capacitor element of the same capacitor segment;
    wherein the multiple banks of capacitor segments are connected in accordance with a predefined connection scheme; and
    wherein a first metal line is selectively connected to a capacitor segment within a first bank of capacitor segments and a second metal line is selectively connected to a capacitor segment within a second bank of capacitor segments.

2. The multi-segment capacitor of claim 1, wherein the multiple banks of capacitor segments are arranged in a matrix having M rows and N columns;
    the capacitor segment at row I and column J of the matrix is connected in parallel to the capacitor segments in that row (or column); and
    the first metal line is selectively connected to a first column (or row) of capacitor segments and the second metal line is selectively connected to a last column (or row) of capacitor segments.

3. The multi-segment capacitor of claim 1, wherein each capacitor segment has a predetermined capacitance and the multi-segment capacitor has a capacitance that is substantially a sum of the predetermined capacitances of the multiple capacitor segments.

4. The multi-segment capacitor of claim 1, wherein the longitudinal axis of the conductive fingers of the first capacitor element of the Capacitor segment is perpendicular to the longitudinal axis of the conductive fingers of the second capacitor element of the same capacitor segment.

5. The multi-segment capacitor of claim 4, wherein the longitudinal axis of the conductive fingers of the first capacitor element is parallel to the longitudinal axis of the conductive fingers of a third capacitor element, and the third capacitor element is separated from the first capacitor element by the second capacitor element.

6. The multi-segment capacitor of claim 5, wherein the conductive fingers of the first capacitor element has a spatial sequence different from that of the third capacitor element.

7. The multi-segment capacitor of claim 1, wherein each column of M capacitor segments connected in parallel includes a first terminal and a second terminal, and the first terminal is connected to the first metal line and the second terminal is connected to the second metal line.

8. The multi-segment capacitor of claim 1, wherein the first metal line and the second metal line are in a same metal layer.

9. The multi-segment capacitor of claim 1, wherein the first metal line and the second metal line are in two different metal layers.

* * * * *